US008984249B2

(12) United States Patent
Pyeon et al.

(10) Patent No.: US 8,984,249 B2
(45) Date of Patent: Mar. 17, 2015

(54) ID GENERATION APPARATUS AND METHOD FOR SERIALLY INTERCONNECTED DEVICES

(75) Inventors: Hong Beom Pyeon, Kanata (CA); HakJune Oh, Kanata (CA); Jin-Ki Kim, Ottawa (CA); Steven Przybylski, Ann Arbor, MI (US)

(73) Assignee: NovaChips Canada Inc., Ottawa, Ontario (CA)

( * ) Notice: Subject to any disclaimer, the term of this patent is extended or adjusted under 35 U.S.C. 154(b) by 817 days.

(21) Appl. No.: 11/613,563

(22) Filed: Dec. 20, 2006

(65) Prior Publication Data

US 2008/0155219 A1 Jun. 26, 2008

(51) Int. Cl.
*G06F 12/00* (2006.01)
*G11C 7/20* (2006.01)
*G06F 13/42* (2006.01)
*G11C 7/10* (2006.01)
*G11C 19/00* (2006.01)
*G11C 29/44* (2006.01)

(52) U.S. Cl.
CPC .............. *G11C 7/20* (2013.01); *G06F 13/4291* (2013.01); *G11C 7/10* (2013.01); *G11C 7/1003* (2013.01); *G11C 19/00* (2013.01); *G11C 2029/4402* (2013.01)
USPC ........... 711/167; 711/170; 711/111; 710/105; 710/305

(58) Field of Classification Search
USPC ......................................................... 711/167
See application file for complete search history.

(56) References Cited

U.S. PATENT DOCUMENTS

| 4,174,536 | A | | 11/1979 | Misunas et al. |
| 4,360,870 | A | * | 11/1982 | McVey .............................. 710/9 |
| 4,733,376 | A | | 3/1988 | Ogawa |
| 4,796,231 | A | | 1/1989 | Pinkham |

(Continued)

FOREIGN PATENT DOCUMENTS

| JP | 09293393 | 11/1997 |
| JP | 2000133000 | 5/2000 |

(Continued)

OTHER PUBLICATIONS

Samsung Electronics Co. Ltd, "256M x 8 Bit / 128 M x 16 Bit / 512M x 8 Bit NAND Flash Memory", K9K4G08U1M, May 6, 2005, pp. 1-41.

(Continued)

*Primary Examiner* — Aimee Li
*Assistant Examiner* — Prasith Thammavong
(74) *Attorney, Agent, or Firm* — Shin Hung; Borden Ladner Gervais LLP

(57) ABSTRACT

A plurality of memory devices (e.g., DRAMs, SRAMs, NAND Flash, NOR Flash) is serially interconnected. Each of the interconnected devices receives a device identifier (ID) and latches it as its ID. Each device includes a circuit for calculating another ID or an incremented ID to generate it. The generated ID is transferred to another device and the ID is incremented in each of the devices in the serial interconnection. The last device in the interconnection provides a last generated ID that is provided to a memory controller having a recognition circuit that recognizes the total number of the serially interconnected devices, from the provided last generated ID. The recognition circuit recognizes the total output latency of the devices in the serial interconnection.

19 Claims, 15 Drawing Sheets

(56) References Cited

U.S. PATENT DOCUMENTS

| | | | |
|---|---|---|---|
| 5,126,808 A | 6/1992 | Montalvo et al. | |
| 5,136,292 A | 8/1992 | Ishida | |
| 5,175,819 A | 12/1992 | Le Ngoc et al. | |
| 5,243,703 A | 9/1993 | Farmwald et al. | |
| 5,280,539 A | 1/1994 | Yeom et al. | |
| 5,319,598 A | 6/1994 | Aralis et al. | |
| 5,357,621 A | 10/1994 | Cox | |
| 5,365,484 A | 11/1994 | Cleveland et al. | |
| 5,404,460 A * | 4/1995 | Thomsen et al. | 710/9 |
| 5,430,859 A | 7/1995 | Norman et al. | |
| 5,440,694 A | 8/1995 | Nakajima | |
| 5,452,259 A | 9/1995 | McLaury | |
| 5,473,563 A | 12/1995 | Suh et al. | |
| 5,473,566 A | 12/1995 | Rao | |
| 5,473,577 A | 12/1995 | Miyake et al. | |
| 5,596,724 A | 1/1997 | Mullins et al. | |
| 5,602,780 A | 2/1997 | Diem et al. | |
| 5,636,342 A | 6/1997 | Jeffries | |
| 5,671,178 A | 9/1997 | Park et al. | |
| 5,721,840 A | 2/1998 | Soga | |
| 5,740,379 A | 4/1998 | Hartwig | |
| 5,761,146 A | 6/1998 | Yoo et al. | |
| 5,771,199 A | 6/1998 | Lee | |
| 5,802,006 A | 9/1998 | Ohta | |
| 5,806,070 A | 9/1998 | Norman et al. | |
| 5,818,785 A | 10/1998 | Ohshima | |
| 5,828,899 A | 10/1998 | Richard et al. | |
| 5,835,935 A | 11/1998 | Estakhri et al. | |
| 5,859,809 A | 1/1999 | Kim | |
| 5,860,080 A | 1/1999 | James et al. | |
| 5,872,994 A | 2/1999 | Akiyama et al. | |
| 5,937,425 A | 8/1999 | Ban | |
| 5,941,974 A | 8/1999 | Babin | |
| 5,959,930 A | 9/1999 | Sakuria | |
| 5,995,417 A | 11/1999 | Chen et al. | |
| 6,002,638 A | 12/1999 | John | |
| 6,085,290 A | 7/2000 | Smith et al. | |
| 6,091,660 A | 7/2000 | Sasaki et al. | |
| 6,107,658 A | 8/2000 | Itoh et al. | |
| 6,144,576 A | 11/2000 | Leddige et al. | |
| 6,148,364 A | 11/2000 | Srinivasan et al. | |
| 6,178,135 B1 | 1/2001 | Kang | |
| 6,304,921 B1 | 10/2001 | Rooke | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,438,064 B2 | 8/2002 | Ooishi | |
| 6,442,098 B1 | 8/2002 | Kengeri | |
| 6,442,644 B1 | 8/2002 | Gustavson et al. | |
| 6,535,948 B1 | 3/2003 | Wheeler et al. | |
| 6,584,303 B1 | 6/2003 | Kingswood et al. | |
| 6,594,183 B1 | 7/2003 | Lofgren et al. | |
| 6,601,199 B1 | 7/2003 | Fukuda et al. | |
| 6,611,466 B2 | 8/2003 | Lee et al. | |
| 6,658,509 B1 | 12/2003 | Bonella et al. | |
| 6,658,582 B1 | 12/2003 | Han | |
| 6,680,904 B1 | 1/2004 | Kaplan et al. | |
| 6,715,044 B2 | 3/2004 | Lofgren et al. | |
| 6,718,432 B1 | 4/2004 | Srinivasan | |
| 6,732,221 B2 | 5/2004 | Ban | |
| 6,754,807 B1 | 6/2004 | Parthasarathy et al. | |
| 6,763,426 B1 | 7/2004 | James et al. | |
| 6,807,103 B2 | 10/2004 | Cavaleri et al. | |
| 6,816,933 B1 | 11/2004 | Andreas | |
| 6,850,443 B2 | 2/2005 | Lofgren et al. | |
| 6,853,557 B1 | 2/2005 | Haba et al. | |
| 6,853,573 B2 | 2/2005 | Kim et al. | |
| 6,903,574 B2 | 6/2005 | Chen et al. | |
| 6,928,501 B2 | 8/2005 | Andreas et al. | |
| 6,944,697 B2 * | 9/2005 | Andreas | 710/110 |
| 6,950,325 B1 | 9/2005 | Chen | |
| 6,967,874 B2 | 11/2005 | Hosono | |
| 6,996,644 B2 | 2/2006 | Schoch et al. | |
| 7,032,039 B2 | 4/2006 | DeCaro | |
| 7,073,022 B2 | 7/2006 | El-Batal et al. | |
| 2002/0188781 A1 * | 12/2002 | Schoch et al. | 710/107 |
| 2003/0074505 A1 * | 4/2003 | Andreas et al. | 710/110 |
| 2003/0112685 A1 * | 6/2003 | Duh et al. | 365/221 |
| 2003/0128702 A1 | 7/2003 | Satoh et al. | |
| 2004/0001380 A1 | 1/2004 | Becca et al. | |
| 2004/0019736 A1 | 1/2004 | Kim et al. | |
| 2004/0024960 A1 | 2/2004 | King et al. | |
| 2004/0039854 A1 | 2/2004 | Estakhri et al. | |
| 2004/0148482 A1 | 7/2004 | Grundy et al. | |
| 2004/0199721 A1 | 10/2004 | Chen | |
| 2004/0230738 A1 | 11/2004 | Lim et al. | |
| 2005/0099833 A1 * | 5/2005 | Perroni et al. | 365/63 |
| 2005/0160218 A1 | 7/2005 | See et al. | |
| 2005/0213421 A1 | 9/2005 | Polizzi et al. | |
| 2006/0050594 A1 | 3/2006 | Park | |

FOREIGN PATENT DOCUMENTS

| | | |
|---|---|---|
| JP | 2003122625 | 4/2003 |
| JP | 2005122823 | 5/2005 |
| JP | 2006195835 | 7/2006 |
| JP | 2007157266 | 6/2007 |
| WO | WO 92/04675 A1 | 3/1992 |
| WO | 01/69411 A2 | 9/2001 |

OTHER PUBLICATIONS

Toshiba, "2GBIT (256M x 8 Bits) CMOS NAND E2PROM", TH58NVG1S3AFT05, May 19, 2003, pp. 1-32.

Amtel Corp., "High Speed Small Sectored SPI Flash Memory", pp. 1-23, 2006.

64 Megabit CMOS 3.0 Volt Flash Memory with 50MHz SPI, Spansion, pp. 1-22 (2006).

King, et al., "Communicating with Daisy Chained MCP42XXX Digital Potentiometers", Microchip AN747, pp. 1-8, 2001.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-126, Dec. 23, 2005.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, 10 pages.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 8 pages.

"HyperTransport™ I/O Link Specification", Revision 2.00b, Document No. HTC20031217-0036-00-10, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0/8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

(56) References Cited

OTHER PUBLICATIONS

Gjessing, S., et al., "A RAM Link for High Speed", Special Report/ Memory, IEEE Spectrum, pp. 52-53, Oct. 1992.
Diamond, S.L., "SyncLink: High: High-speed DRAM for the Future", Micro Standards, IEEE Micro, pp. 74-75, Dec. 1996.
Samsung Electronics, "DDR2 Fully Buffered DIMM 240pin FBDIMMS based on 512Mb C-die" Rev. 1.3, Sep. 2006, pp. 1-32, Sep. 2006.
"HyperTransport TM I/O Link Specification", Revision 3.00, Document No. HTC20051222-0046-0008, Hypertransport Technology Consortium, pp. 1-428, Apr. 2006.
"8-megabit 2.5-volt Only or 2.7-volt Only DataFlash®," Technical Specification, Atmel, Rev. 2225H-DFLSH (2004).
Samsung Electronics, "K9XXG08UXM Preliminary Flash Memory," Technical Specification, Samsung Electronics.
"1024K12C™ CMOS Serial EEPROM," Technical Specification, Microchip Technology Inc., (2006).
"The I2C-Bus Specification," Version 2.1, Philips Semiconductors, Jan. 2000.
"16 Mbit LPC Serial Flash," Preliminary Specification, Silicon Storage Technology Inc., (2006).
"16 Mbit SPI Serial Flash," Preliminary Specification, Silicon Storage Technology Inc., (2005).
"2Mbit, Low Voltage, Serial Flash Memory with 40 Mhz SPI Bus Interface," Technical Specification, STMicroelectronics Group of Companies (2005).
"NAND Flash Applications Design Guide," Revision 1.0, Toshiba America Electronics Components, Inc., (Apr. 2003).

\* cited by examiner

ID GENERATION APPARATUS AND METHOD FOR SERIALLY INTERCONNECTED DEVICES

FIELD OF THE INVENTION

The present invention relates to an apparatus and method for generating device identifiers in serially interconnected devices. Also, the present invention relates to an apparatus and method for recognizing the number of the serially connected devices and the output latency of the serial interconnected devices.

BACKGROUND OF THE INVENTION

Current consumer electronic equipment uses memory devices. For example, mobile electronic devices such as digital cameras, portable digital assistants, portable audio/video players and mobile terminals continue to require mass storage memories, preferably non-volatile memory, with ever increasing capacities and speed capabilities. Non-volatile memory and hard-disk drives are preferred since data is retained in the absence of power, thus extending battery life.

While existing memory devices operate at speeds sufficient for many current consumer electronic devices, such memory devices may not be adequate for use in future electronic devices and other devices where high data rates are desired. For example, a mobile multimedia device that records high definition moving pictures is likely to require a memory module with a greater programming throughput than one with current memory technology. While such a solution appears to be straightforward, there is a problem with signal quality at such high frequencies, which sets a practical limitation on the operating frequency of the memory. The memory communicates with other components using a set of parallel input/output (I/O) pins, the number of which depends on the desired configuration. The I/O pins receive command instructions and input data and provide output data. This is commonly known as a parallel interface. High speed operation may cause communication deleterious effects such as cross-talk, signal skew and signal attenuation, for example, which degrade signal quality. In order to incorporate higher density and faster operation on the system boards, there are two design techniques: serial interconnection and multi-drop configurations. These design techniques may be used to overcome the density issue that determines the cost and operating efficiency of memory swapping between a hard disk and a memory system. However, multi-drop configurations have shortcomings relative to the serial interconnection of memory systems. For example, if the number of multi-drop memory systems increases, as a result of the loading effect of each pin, the delay time also increases so that the total performance of the multi-drop configuration is degraded by the multi-drop connection caused by the wire resistor-capacitor loading and the pin capacitance of the memory device. A serial link in a device such as a memory device may utilize a single pin input that receives all addresses, commands, and data serially. The serial link may provide a serial interconnection configuration to control command bits, address bits, and data bits effectively through the serial interconnection. By providing a serial interconnection configuration, a device identifier (ID) number is assigned to each device on a connected chain. The assignment of an ID number to each device is required for producing IDs of the interconnected devices.

SUMMARY OF THE INVENTION

In accordance with one aspect of the present invention, there is provided a system comprising a plurality of memory devices in a serial interconnection configuration. Each of the plurality of memory of the devices has an input connection and an output connection. The input and the output connection of each respective device are coupled to the output connection of a previous device and the input connection of a next device, respectively. Each of the plurality of memory devices includes a production circuit for producing a device identifier (ID). The ID produced by each respective device is to be provided to its next device. The system also includes a receiving circuit for receiving the ID from a last device of the serial interconnection configuration and for determining a device related characteristic of the serial interconnection configuration of the plurality of memory devices.

For example, the production circuit includes an ID receiver for receiving the ID from the previous device through the input connection thereof, an ID generation circuit for generating an ID in response to the received ID, and an ID outputting circuit for outputting the ID generated by the ID generation circuit. The ID generation circuit may include a calculation circuit for calculating the received ID using a pre-defined value. An example of the calculation circuit is an addition circuit for adding one or a subtraction circuit for subtracting one from the received ID to provide a new ID.

Advantageously, the ID receiver includes a registering circuit for registering the received ID in serial manner; and an output circuit for outputting each of the registered ID in parallel manner, thereby providing the ID for the calculation.

The receiving circuit may include a processing circuit for receiving the ID from the last device and determining the number of devices in the serial interconnection configuration in response to the received ID.

Advantageously, the system may include a providing circuit for providing an initial ID to the first device in the serial interconnection configuration.

The receiving circuit may include a processing circuit for receiving the ID from the last device in the serial interconnection configuration, the ID being provided through the input connection of that device; and for determining the latency of the devices in the serial interconnection configuration in response to the received ID.

In accordance with another aspect of the present invention, there is provided a method for determining the characteristic of a plurality of memory devices in a serial interconnection configuration, each of the plurality of memory devices having an input connection and an output connection, the input and output connection of each respective device being coupled to the output connection of a previous device and the input connection of a next device, each of the plurality of memory devices including a production circuit for producing a device identifier (ID), the ID produced by each respective device to be provided to its next device. The method includes receiving the ID from a last device in the serial interconnection configuration and determining a device related characteristic of the serial interconnection configuration of the plurality of memory devices in response to the received ID.

The method may further include providing an initial ID to a first device of the plurality of memory devices of the serial interconnection configuration and providing an ID from a last device for determining the device related characteristic of the serial interconnection configuration.

Advantageously, the step of determining includes determining the number of the devices in the serial interconnection configuration in response to the received ID or determining the latency of the devices in the serial interconnection configuration in response to the received ID.

In accordance with a further aspect of the present invention, there is provided a recognition apparatus for use in a plurality of memory devices in a serial interconnection configuration, each of the plurality of memory devices having an input connection and an output connection, the input and output connection of each respective device being coupled to the output connection of a previous device and the input connection of a next device. Each of the plurality of memory devices includes a production circuit for producing a device identifier (ID). The ID produced by each respective device is provided to its next device. The apparatus includes a receiving circuit for: receiving a device identifier (ID) from a last device in the serial interconnection configuration; and determining a device related characteristic of the serial interconnection configuration of the plurality of memory devices in response to the received ID.

The receiving circuit may include a determination circuit for determining the number of interconnected devices based on a value associated with the received ID and/or for determining a latency of the plurality of memory devices based on a value associated with the received ID.

Other aspects and features of the present invention will become apparent to those ordinarily skilled in the art upon review of the following description of specific embodiments of the invention in conjunction with the accompanying Figures.

BRIEF DESCRIPTION OF THE DRAWINGS

Embodiments of the present invention will now be described, by way of example only, with reference to the attached figures, wherein.

DETAILED DESCRIPTION

Figure 1A:
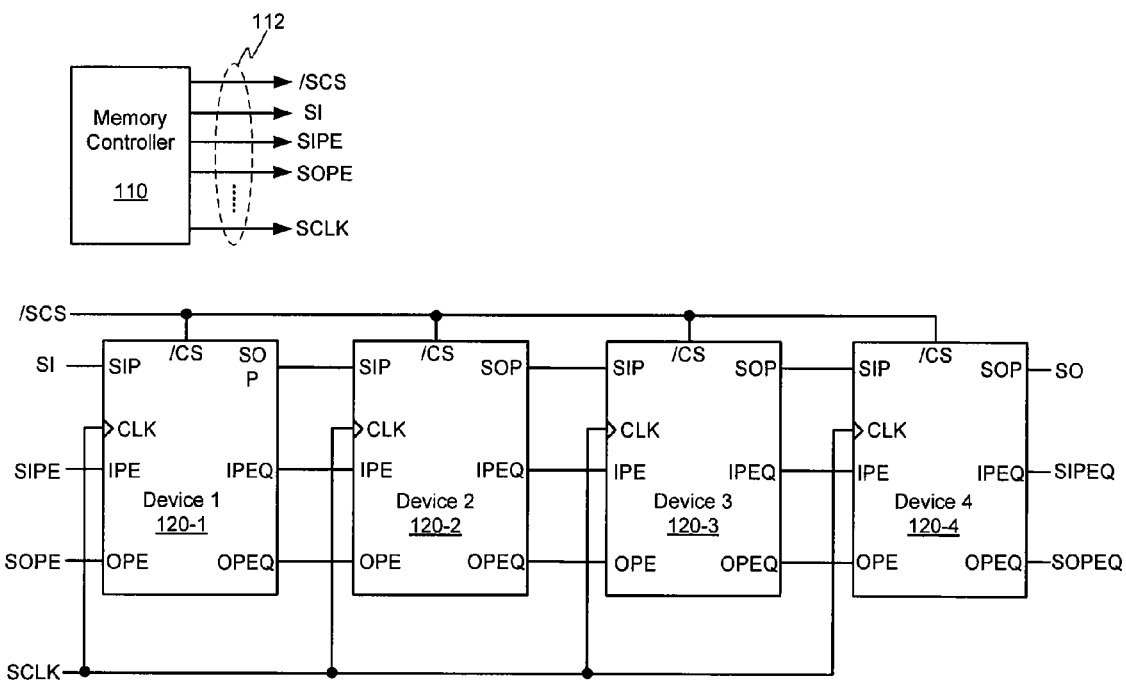
FIG. 1A is a block diagram illustrating memory devices employing a serial interconnection implementation to which embodiments of the present invention are applied.

In the following detailed description of sample embodiments of the present invention, reference is made to the accompanying drawings which form a part hereof. The drawings illustrate specific embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Generally, the present invention provides an apparatus and method for processing and capturing serial input data with ID generation in serially interconnected devices.

Some memory subsystems employ multiple Flash devices with serial interfaces. Here, the command string may be fed to all of the devices even though the command may only be performed on one of the devices. To select the device on which the command is to be performed, the command string may contain a device identifier (ID) that identifies the Flash device to which the command is directed. Each device receiving the command string compares the ID contained in the command string to an ID associated with the device. If the two match, the device assumes the command is directed to itself and performs the command.

A problem with the above-described arrangement involves establishing an ID for each device. One technique that may be used to establish an ID for a device is to hardwire an internal, unique, ID into the device. One drawback with this approach, however, is that if large numbers of devices are used, the size of the ID may have to be quite long in order to ensure that each device contains a unique ID. Managing a large-sized device ID may add significant complexity to the device which in turn may increase the cost of producing the device. In addition, reclaiming device IDs that are associated with devices that are no longer in use may further add to the complexity of this scheme.

Another approach to assigning IDs to devices involves externally hardwiring an ID for each device. Here, the ID may be specified by wiring various pins on the device to certain states to establish an ID for the device. The device reads the wired state of the pins and establishes its ID from the read state. One drawback with this approach, however, is that external wiring is needed to assign the ID for each device. This may add to the complexity of, e.g., printed circuit boards (PCBs) that hold the memory devices. Another drawback with this approach is that it may require pins to be dedicated for the assignment of the ID. This may consume precious resources that may be otherwise better used. In addition, dedicating pins for the assignment of the ID may require a greater footprint for the device than if pins were not used to assign the ID.

Embodiments of the present invention address these shortcomings. They automatically establish an ID for a device, for example, in a serial interconnection arrangement, in a manner that does not require special internal or external hardwiring of the ID. According to an aspect of the techniques described herein, an input signal is transmitted through a serial interconnection to a first device in an arrangement including multiple devices (e.g., a serial interconnection arrangement) using inputs that are also used by the first device to input other information to the device (e.g., data, commands, control signals). A generating circuit generates a device ID in response to the input signal. A transfer circuit then transfers an output signal associated with the ID to a second memory device through a serial output of the first device. The serial output may also be used by the first device to output other information (e.g., signals, data) to other devices in the arrangement.

In an embodiment of the techniques described herein, a write ID operation is initiated at a device in a serial interconnection arrangement to cause the device to establish an ID. A first device receives a first value by acquiring the state of one or more inputs of the first device. The first device then establishes a device ID from the first value, which may include placing the first value in storage (e.g., a device ID register) associated with the device. The first device generates a second value from the acquired state of the inputs. The first device outputs the second value from the first device via outputs of the first device to a second device in the serial interconnection. The second device inputs the value output by the first device and repeats this process to establish an ID.

Embodiments of the present invention will now be described in conjunction with a MISL (multiple independent serial link). A MISL product is a unique item in the Flash memory area that enhances the operation performance without change to the core structure. It is an innovation of interface and data processing of Flash memories. Due to the restriction of Flash cell structure and limited performance of the cell, the enhancement of Flash performance has been a key issue to be resolved in the memory industry. Most products including Flash memory core have parallel ports that latch simultaneously all address bits, all command bits, and all data bits, respectively. A serial link utilizes a single pin input for receiving all address, command, and data serially. A detail of MISL is described in U.S. patent application Ser. No. 11/324,023 filed Dec. 30, 2005; U.S. Provisional Patent Application No. 60/787,710 entitled "Serial interconnection of Memory Devices" filed Mar. 28, 2006; and U.S. Provisional Patent Application No. 60/802,645 entitled "Serial interconnection of Memory Devices" filed May 23, 2006, the contents of which are entirely incorporated herein by reference.

FIG. 1A shows an exemplary device configuration including a plurality of single port devices configured in a serial interconnection arrangement having inputs and outputs for various signals, together with a memory controller. In this example, the device configuration includes four memory devices 1, 2, 3 and 4 (120-1, 120-2, 120-3 and 120-4). Each of the interconnected devices 120-1-120-4 has the same structure. A memory controller 110 provides a group of signals 112 containing chip select /SCS, serial input SI, input port enable SIPE, output port enable SOPE, clock SCLK, and other control and data information that are provided to the devices.

Figure 1B:
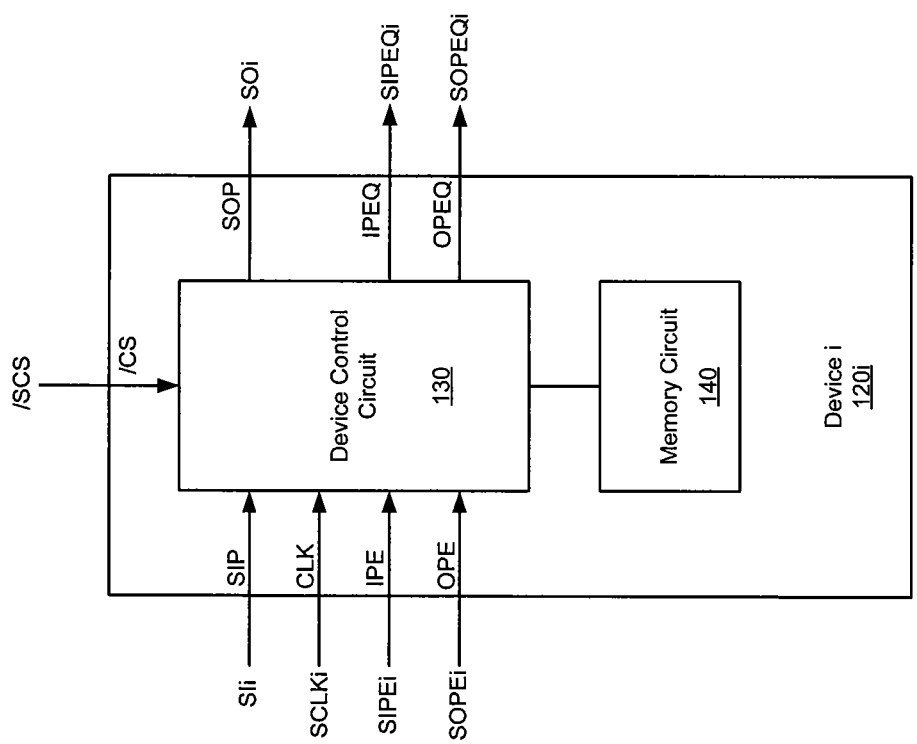
FIG. 1B is a block diagram of one of the devices shown in FIG. 1A.

FIG. 1B shows one device 120$i$ representing any one of the devices 120-1-120-4 shown in FIG. 1A. The device 120$i$ includes a device control circuit 130 and a memory circuit 140 including, for example, such as dynamic random access memory (DRAM) cells, static random access memory (SRAM) cells, or Flash memory cells. The device 120$i$ has a serial input port (SIP) connection, a serial output port (SOP) connection, a chip select input (/CS), and a clock input (CLK). SIP is used to transfer information (e.g., command, address and data information) into the device 120$i$. The SOP is used to transfer information from the device 120$i$. CLK receives a clock signal./CS receives a chip select signal /SCS, which enables operations at all devices simultaneously. The device control circuit 130 performs various control and process functions with access to the memory circuit 140 in response to the input signals (e.g., SI, SIPE, SOPE, SCLK), and provides serial output data to the next device 120($i$−1).

Referring to FIGS. 1A and 1B, the SIP and the SOP are connected between devices in the serial interconnection arrangement such that the SOP of a previous device 120($i$−1) in the serial interconnection is coupled to the SIP of the device 120$i$ in the serial interconnection. For example, the SOP of device 1, 120-1, is coupled to the SIP of device 2, 120-2. The clock input CLK of each of the four devices 120-1-120-4 is fed, with the clock signal SCLK, from the memory controller 110. The clock signal SCLK is distributed to all devices via a common link. As will be described further below, SCLK is used to latch information input to the device 120$i$ at various registers contained therein. /CS is a conventional chip select input for selecting the device. /CS is coupled to a common link which enables the chip select signal /SCS to be asserted to all of the devices (120-1-120-4) concurrently and consequently, selects all of the devices.

In addition, a device 120$i$ has an input port enable input (IPE), an output port enable input (OPE), an input port enable output (IPEQ) and an output port enable output (OPEQ). The IPE is used to input the input port enable signal SIPEi to the device 120$i$. The signal SIPEi is used by the device to enable a SIP such that when the IPE is asserted, information is serially input to the device 120$i$ via the SIP. Likewise, the OPE is used to input the output port enable signal SOPEi to the device 120$i$. The signal SOPEi is used by the device to enable the SOP such that when the OPE is asserted, information is serially output from the device 120$i$ via the SOP. The IPEQ and OPEQ are outputs that output the signals SIPEQi and SOPEQi, respectively, from the device 120$i$. The /CS and CLK are coupled to separate links which distribute the chip select signal /SCS and clock signal SCLK, respectively, to the four devices, 120-1-120-4, as described above.

The SIP and SOP are coupled from previous device 120($i$−1) to next device 120($i$−1) in the serial interconnection arrangement, as described above. Moreover, the IPEQ and OPEQ of the previous device 120($i$−1) are coupled to the IPE and OPE, respectively, of the present device 120$i$ in the serial interconnection. This arrangement allows the signals SIPE and SOPE to be transferred from one device to the next (e.g., device 1, 120-1, to device 2, 120-2) in a serial interconnection fashion.

Figure 2A:
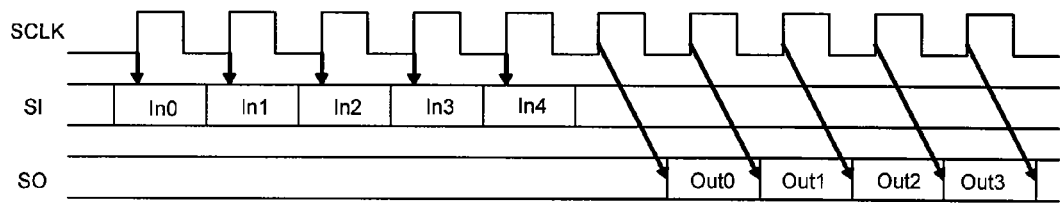
FIG. 2A illustrates a timing diagram of single data rate (SDR) operation of memory devices.
Figure 2B:
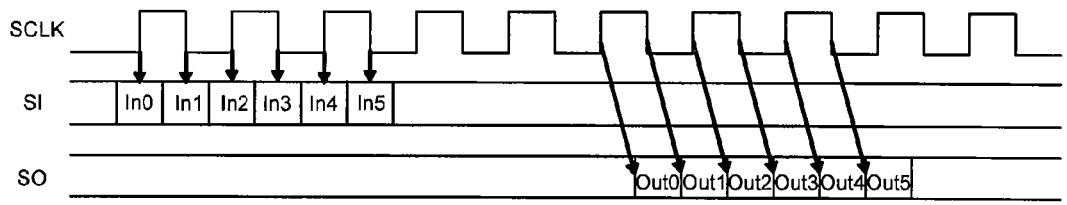
FIG. 2B illustrates a timing diagram of double data rate (DDR) operation of memory devices.

Information transmitted to the devices 120-1-120-4 can be latched at different times of the clock signal SCLK fed to the CLK. For example, in a single data rate (SDR) implementation, information input to the device 120$i$ at the SIP can be latched at either the rising or falling edge of the clock signal SCLK. Alternatively, in a double data rate (DDR) implementation, both the rising and falling edges of the clock signal SCLK can be used to latch information input at the SIP. FIG. 2A shows a relative timing sequence for an SDR operation of memory devices. FIG. 2B shows a relative timing sequence for a DDR operation of memory devices. Each of FIGS. 2A and 2B shows operations in one port. In each of the SDR and DDR operations, the chip select signal is commonly connected to enable all devices at the same time, so that input data of the first device is propagated to the last device.

Figure 3A:
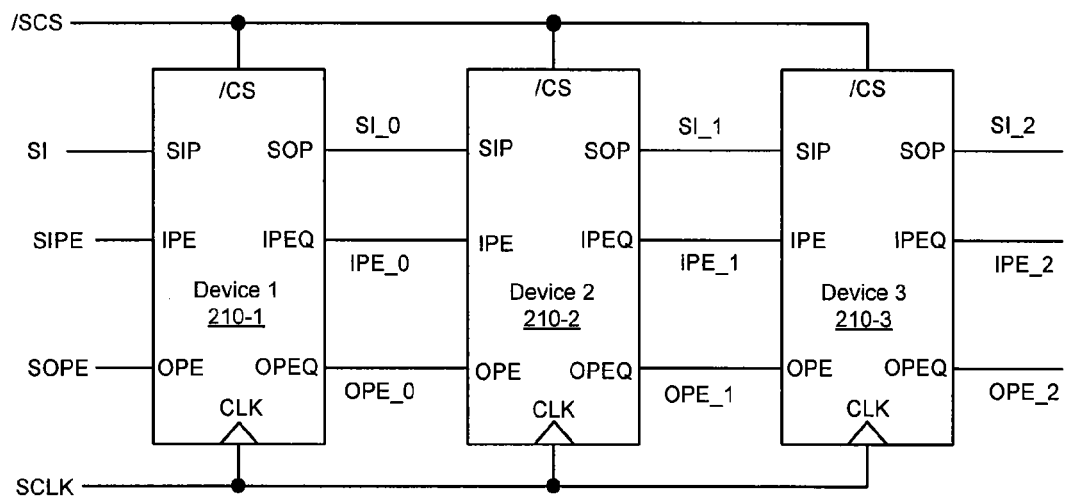
FIG. 3A is a block diagram illustrating a serial interconnection arrangement of three memory devices.
Figure 3B:
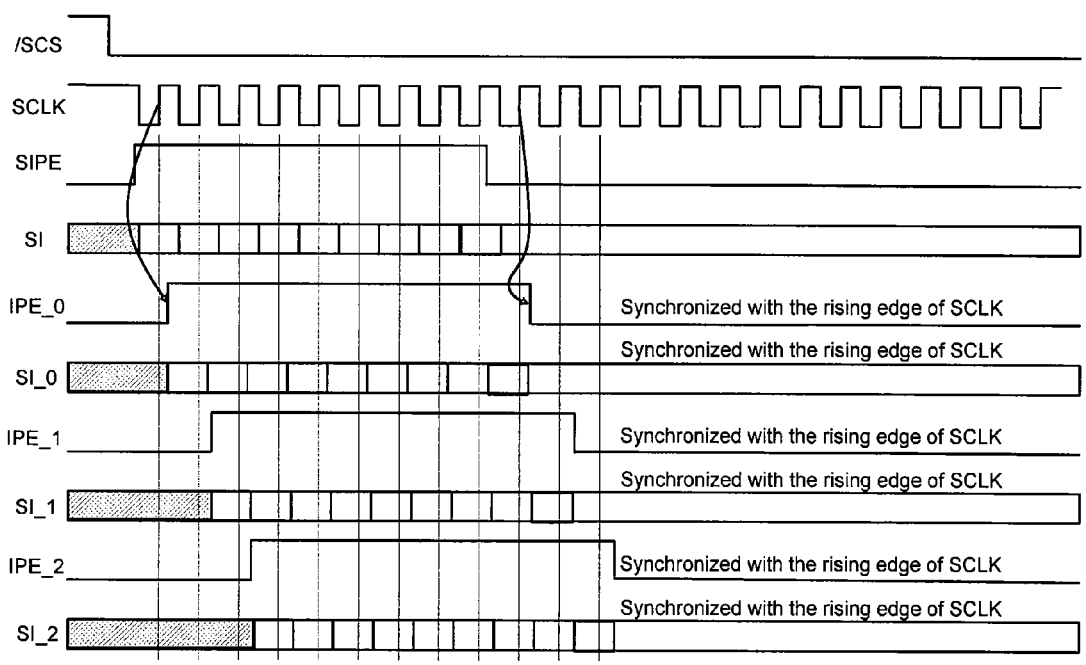
FIG. 3B is a timing diagram illustrating communication between devices configured in the serial interconnection arrangement shown in FIG. 3A.

FIG. 3A shows three devices 210-1-210-3 configured in a serial interconnection arrangement. FIG. 3B shows signals transferred between the devices 210-1-210-3 shown in FIG. 3A. Referring to FIGS. 3A and 3B, the chip select signal /SCS is first asserted to select the devices. Information is transmitted to device 1, 210-1, in the serial interconnection by asserting the IPE and clocking data into device 210-1 on successive rising edges of the clock signal SCLK. The input port enable signal SIPE is propagated through device 1, 210-1, to device 2, 210-2, in less than a cycle, as shown by the signal IPE_0. Similarly, the output port enable signal, SOPE, is propagated through device 1 to device 2. The propagation time interval may be varied depending on the system requirements, e.g., a half cycle time interval or a time interval based on a proportion of cycles. The propagation enables information to be clocked from the SOP of device 1, 210-1, to the SIP of device 2, 210-2, at one cycle after the information was clocked into device 1, 210-1. This process is repeated for successive devices in the serial interconnection. For example, information is inputted to device 3, 210-3, in the serial interconnection at the third rising edge of SCLK from the latch point of the data at device 1. The control signals SIPE and SOPE are synchronized with the rising edge of the clock signal SCLK in order to ensure a proper setup time for these signals at the next device in the serial interconnection.

Figure 4:
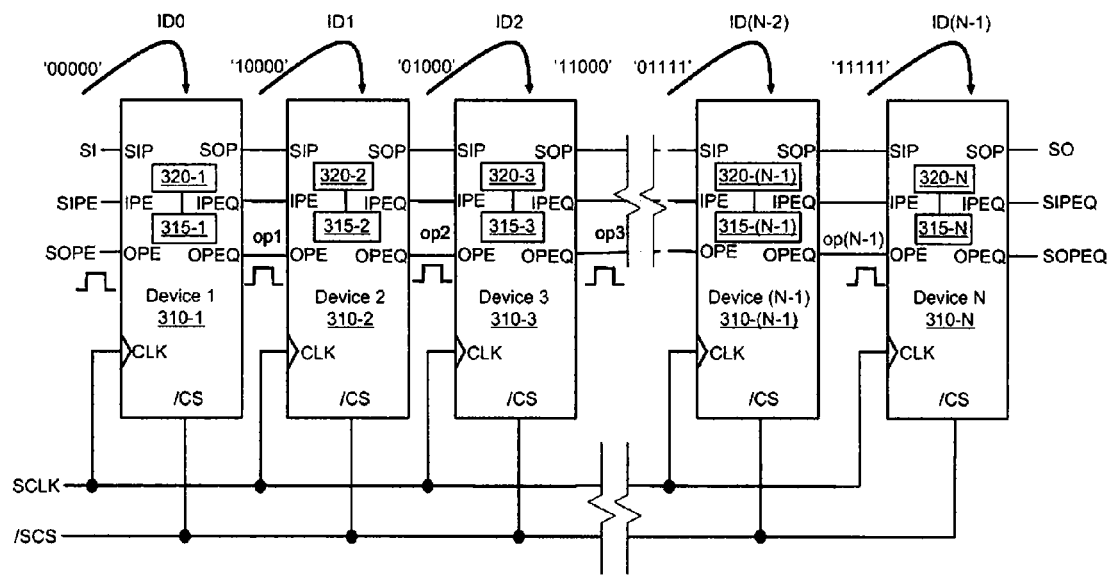
FIG. 4 is a block diagram of a plurality of devices in a serial interconnection configuration operating to establish a device identifier (ID) at each device.
Figure 5:
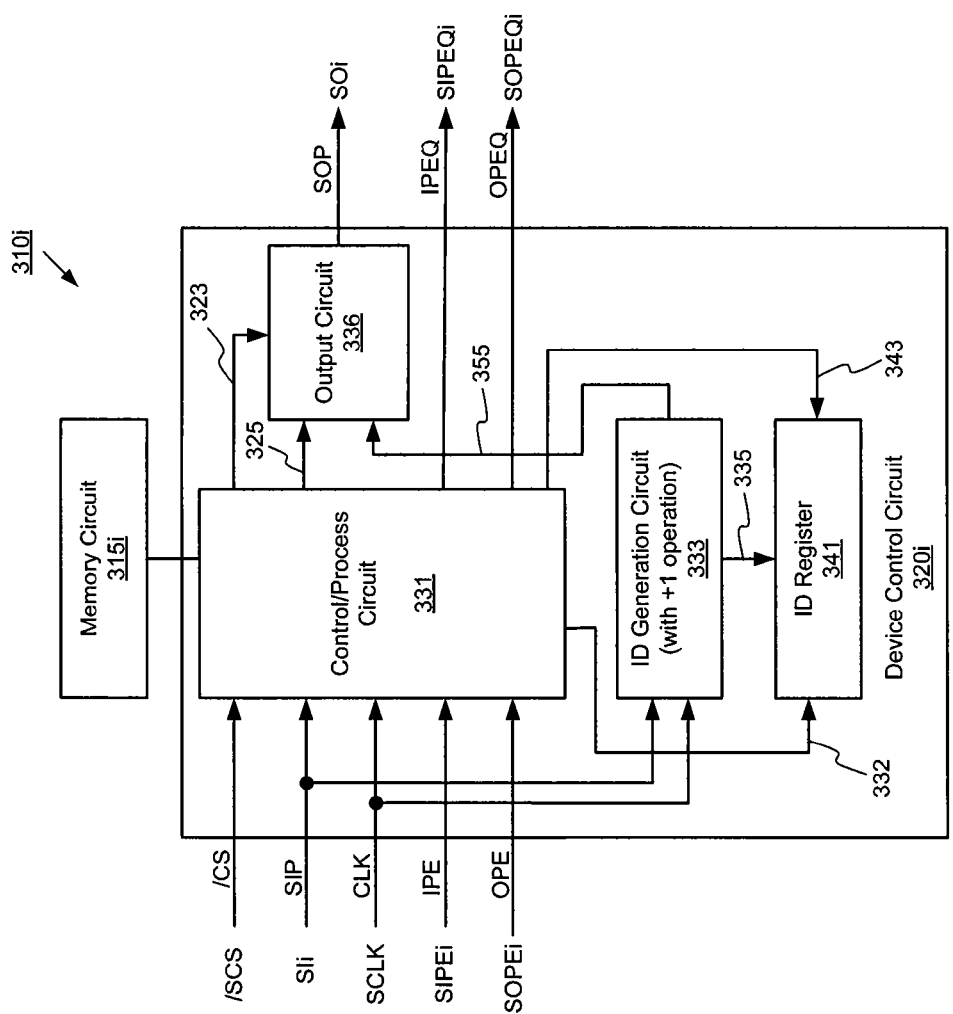
FIG. 5 illustrates one of the devices shown in FIG. 4.

FIG. 4 shows a plurality of devices in a serial interconnection configuration. The devices can include DRAMs, SRAMs, NAND Flash memories or NOR Flash memories or mixed types of memories. Referring to FIG. 4, N memory devices, 310-1-310-N, are connected in a single link arrangement and are serially interconnected. Devices 310-1-310-N include device control circuits 320-1-320-N and memory circuits 315-1-315-N, respectively. One device 310$i$ is shown in FIG. 5. The device control circuit 320$i$ of the device 310$i$ is connected to the corresponding memory circuit 315$i$. The device control circuit 320$i$ includes a control/process circuit 331, an ID generation circuit 333, an ID register 341 and an output circuit 336. The serial input, SI, to the SIP of the device 310$i$ includes the command, the device identifier (ID), IDii, and other signal data. The control/process circuit 331 receives the serial input SIi, the input port enable signal SIPEi, the output port enable signal SOPEi and performs control and data processing functions. The ID generation circuit 333 is controlled by the control/process circuit 331 and establishes an ID, ID($i$+1), for next device 310($i$+1). The ID generation circuit 333 generates the ID(i+1) that is contained in a serial output ID signal 355. The generated ID(i+1) is provided through the output circuit 336. An ID generation enable signal 323 and a processed data signal 325 are also provided by the control/process circuit 331 to the output circuit 336. In response to an ID write enable signal 343 provided by the control/process circuit 331, the ID register 341 registers the received ID, IDii, for the present device 310$i$. The registered ID is held in the register 341 until powered-off.

Figure 6:
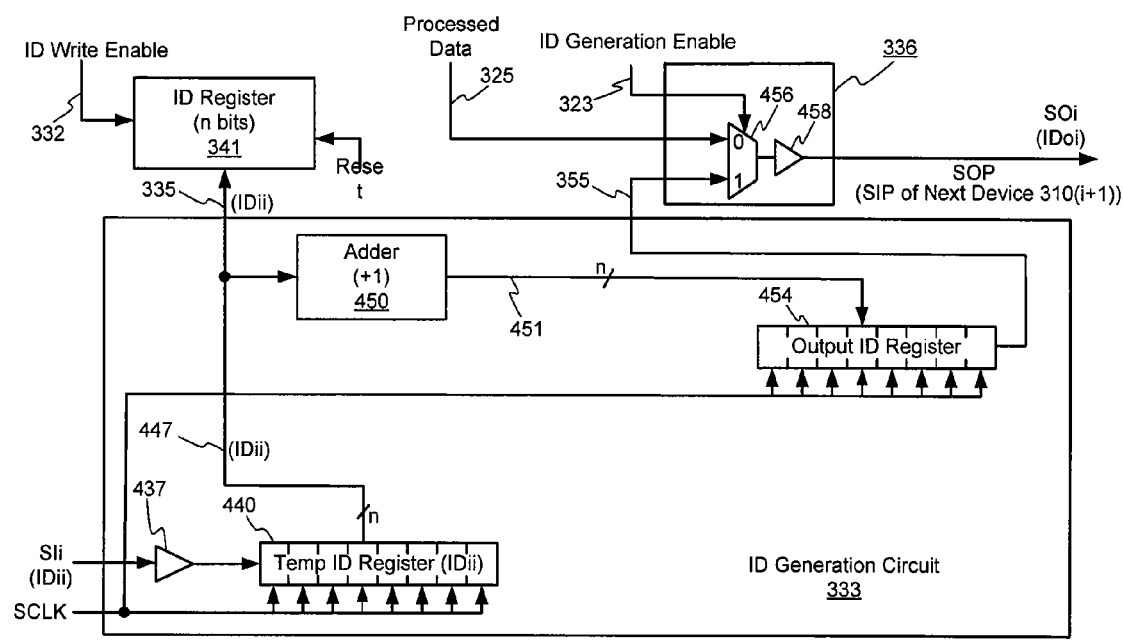
FIG. 6 illustrates an example of the ID generation circuit shown in FIG. 5.

FIG. 6 shows a detailed circuit of the ID generation circuit 333 and the output circuit 336 shown in FIG. 5. Referring to FIGS. 4-6, the ID generation circuit 333 includes a serial input buffer 437 for receiving the serial input SIi through SIP of the device. The received SIi in the ID generation mode setting operation includes a value corresponding to a device ID, IDii, which is a number of n-bits (e.g., eight bits). The clock signal SCLK is fed to a temporary ID register 440. The temporary ID register 440 is a serial-to-parallel register that registers the input serial data therein in response to the clocks of the clock signal SCLK. In the ID generation mode, the n-bit IDii contained in SI is serially shifted into the register 440 in response to SCLK and held therein. The n-bit IDii held in the register 440 is outputted in parallel as n-bit signal 447. The n-bit signal 447 is fed to an adder 450 that provides a calculation signal 451 having a +1 operation value.

The adder 450 adds "1" to IDii, thereby producing the calculation signal 451 containing an ID, IDii+1, for the next device in a sequence of device IDs in the serial interconnection. The adder 450 provides an appropriate function for ID generation when the selected sequence of device ID numbers are consecutive integers from low to high. The signal 451 of "added IDii+1" from the adder 450 is fed to an output ID register 454 that is enabled to register the selected n-bit ID data therein. The output ID register 454 is a parallel-to-serial register. The output ID register 454 outputs the registered data in a serial manner as the serial output ID signal 355, in response to the clock signal SCLK. The serial output ID signal 355 is fed to a selector 456 of the output circuit 336. The selector 456 also receives the processed data signal 325 from the control/process circuit 331 that accesses the memory circuit 315$i$ of the device 310$i$. In response to the ID generation enable signal 323 derived from the generation command by the controller/processor, the selector 456 selects the serial output ID signal 355, or the processed data signal 325, when the ID generation enable signal 323 is "high" (an ID generation mode) and "low" (the normal mode), respectively. A selected signal from the selector 456 is outputted through a serial output buffer 458 to the next device (310($i$+1)) in the serial interconnection.

The ID generation circuit 333 provides the ID signal 335 containing the n-bit ID, IDii, to the ID register 341. In response to the ID write enable signal 332 from the control/process circuit 331, the ID register 341 registers or latches the received ID, IDii, for the present device 310$i$. The registered ID is held until powered-off. The ID register 341 is initially reset to the zero state and thus, if no ID latch occurs, the ID register 341 will hold the zero state.

With reference to FIG. 6, for example, the above ID generation process is completed by the first device (device 1) control/process circuit 331-1. The control/process circuit 331-1 outputs the resulting device ID to the second device (device 2) 310-2. The second device's control/process circuit 331-2, located at device 310-2, performs the same operation as the first device's control/process circuit 331-1, transferring the resulting device ID to the device 310-3. This process is repeated for all devices, 310-1-310-N, in the serial interconnection, until the device ID has passed through all devices.

Figure 7:
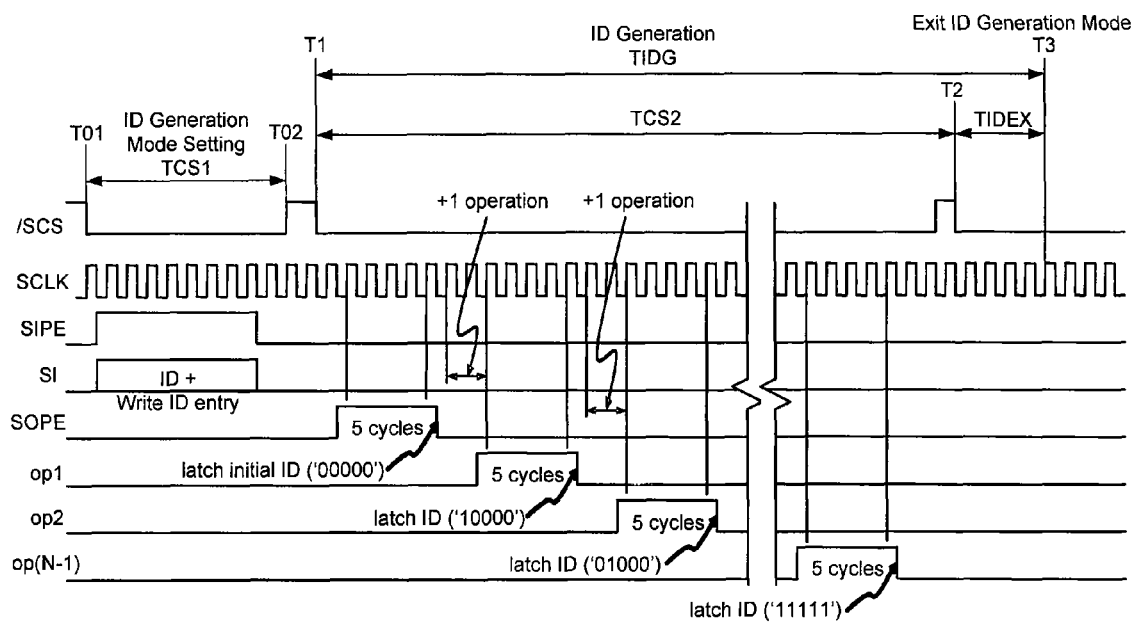
FIG. 7 is a timing diagram of signals transferred between the devices shown in FIG. 4 to establish the ID.

FIG. 7 shows signals transferred between the devices of FIG. 4. This exemplary operation generates IDs in a serial interconnection of a plurality of devices. In the example serial interconnection shown in FIGS. 4-6, device logic at the IPE includes a function to catch a serial input stream based on a one-byte unit so that the OPE is chosen to latch a serial ID input stream after /SCS is "low" again.

In FIG. 7, an ID generation mode setting time period TCS1 between times T01 and T02 is a time interval equivalent to pre-defined clock cycles corresponding to the ID bit length+ eight cycles (command bit length)+an estimated number of devices that may be connected in the serial interconnect configuration. The commands include an "ID generation" command. The SI contains the ID (initial ID (00000')) and a "write ID entry" command as an input stream that are caught by the IPE during the time period TCS1. The TCS1 includes bit cycles of a total number of ID bits, e.g., five cycles. The ID bits are established by the size of an internal ID register. For example, if any device has a 12 bit-ID register, OPE will hold the "high" state during 12 cycles. This means that 4096 devices are connected physically with a serial interconnection arrangement without any pin limitation like the above-mentioned implementation, which makes use of existing pins to send ID number in parallel and asynchronously. After the completion of the ID generation mode setting process, the ID generation operation starts at time T1 and ends with an expiration of a time period TIDG. With an expiration of one chip select cycle TCS2 at time T2, the /SCS is toggled and, with an expiration of a time period TIDEX from time T2, the ID generation ends at time T3. The time period TIDEX between times T2 and T3 is pre-defined by any number of clock cycles depending upon the system (e.g., five clock cycles or five rising edges of the clock pulse after time T2).

Referring to FIGS. 4-7, the serial input SI contains and ID and a "write ID entry". For a signal transfer between the OPE and the OPEQ, or op1 and op2, a non-overlap of more than two cycles, for example, should occur to avoid an operation contention caused by an ID increment and data transferring to an adjacent device. After the OPE is asserted at each of the devices 310-1-310N, the latched ID input data is stored in an ID register (e.g., the serial-to-parallel register 440) of the device and an increment operation with this input is performed before asserting the OPEQ (e.g., by the adder 450). A function of the signal at the OPE is to determine the number of ID bits from 1 bit to the maximum number of defined bits of the ID register into each memory device. Because of this function, the signal corresponding to device ID is transferred to the next device in order, beginning with the least significant bit (LSB) and ending with the most significant bit (MSB). The IDs are shown in Table 1.

TABLE 1

| ID Number | ID Binary Code (LSB → MSB) |
|---|---|
| ID0 (=Initial ID) | 0000 |
| ID1 | 1000 |
| ID2 | 0100 |
| ID3 | 1100 |
| — | — |
| — | — |
| ID(N − 2) | 01111 |
| ID(N − 1) | 11111 |

In this example, N is 32 and the number of the interconnected devices is 32(=N). In another embodiment, N can be any other integer.

The ID stored in the ID register 341 is according to the sequence and ID number itself. For example, if the ID register is 10-bits in length and the OPE has a 5-cycle "high" state, then five bits are included in the ID generation and a signal corresponding to the 5-bit result is transferred to the next device. The remaining bits are ignored and "zero" values are kept in the ID registers.

The ID generator 333 generates a sequence of device ID numbers with consecutive integers from low to high. The resulting device ID assignment is shown in Table 2.

TABLE 2

| Device | Assigned ID Number | ID Code |
|---|---|---|
| 310-1 | ID0 | 00000 |
| 310-2 | ID1 | 10000 |
| 310-3 | ID2 | 01000 |
| — | — | — |
| — | — | — |
| 310-(N − 1) | ID(N − 2) | 01111 |
| 310-N | ID(N − 1) | 11111 |

Figure 8A:
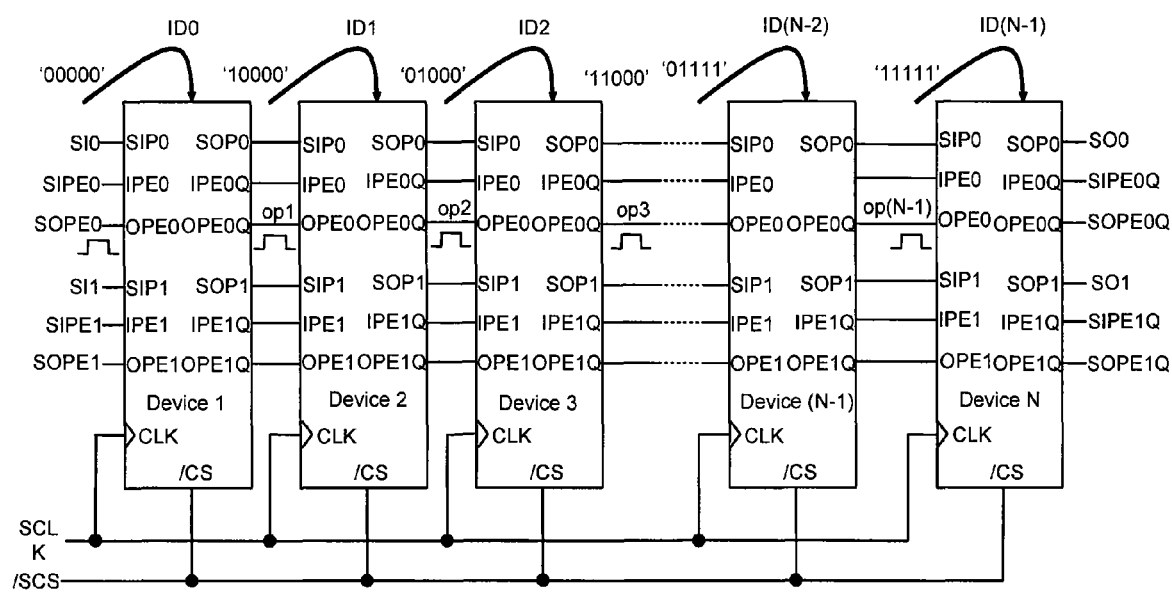
FIG. 8A is a block diagram of a plurality of devices in a serial interconnection configuration operating to establish an ID in a dual link.
Figure 8B:
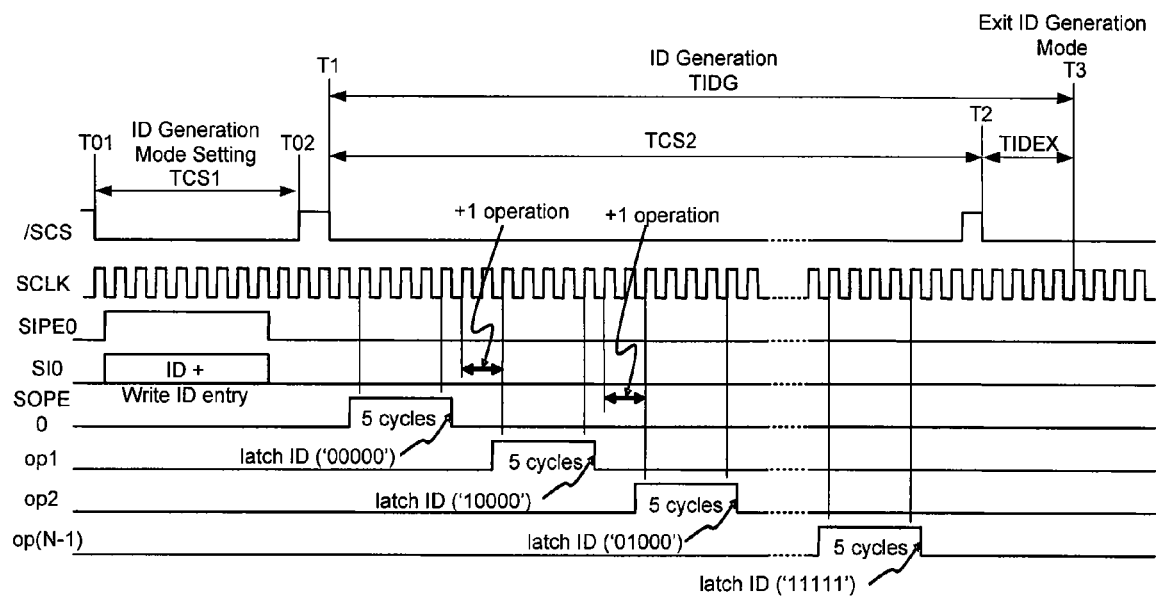
FIG. 8B is a timing diagram of signals transferred between the devices shown in FIG. 8A to establish the ID.

FIG. 8A shows a plurality of devices in a serial interconnection configuration, operating to establish an ID at each device, employing an example of ID generation logic for a dual link. FIG. 8B shows a timing diagram of signals transferred between the devices shown in FIG. 8A to establish IDs. The connection of the devices memories is different from that of FIG. 4. FIG. 8A shows an example that describes how to generate IDs with two input pins of a MISL device of a serial interconnection arrangement. Any serial input pin and one control pin can have the same functionality as depicted in FIG. 8A.

Figure 9:
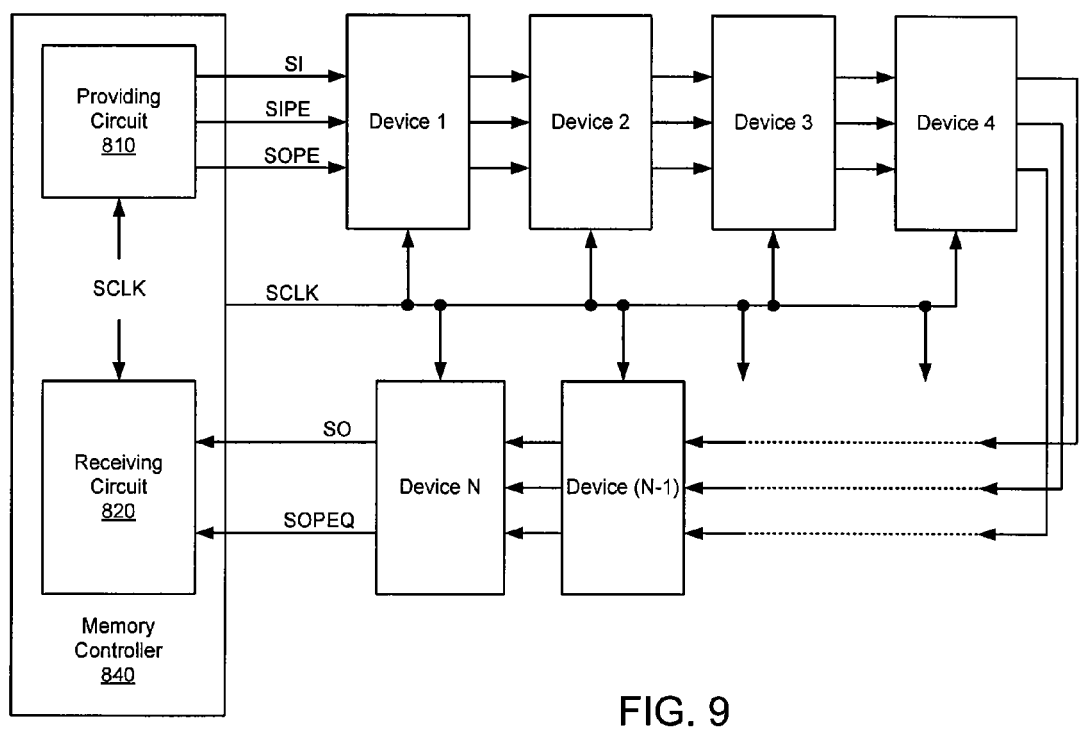
FIG. 9 is a block diagram of a plurality of memory devices in a serial interconnection configuration.
Figure 10:
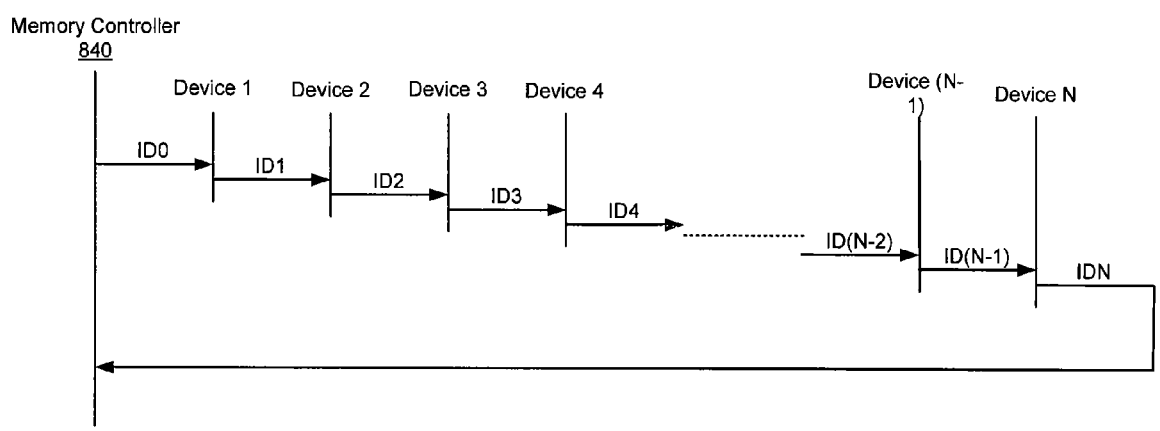
FIG. 10 is a schematic diagram illustrating a protocol conducted in the devices shown in FIG. 9.

FIG. 9 shows a plurality of devices in a serial interconnection configuration operating to establish an ID at each device employing an example of ID generation circuit shown in FIG. 6. FIG. 10 shows an example of a protocol conducted in the devices shown in FIG. 9.

Referring to FIGS. 9 and 10, a memory controller 840 includes a providing circuit 810 and a receiving circuit 820 operating with a clock signal SLK. The clock signal CLK is also fed to serially interconnected devices 1-N through a common link. The memory controller 840 includes a providing circuit 810 that provides an initial ID, ID0 (e.g., value "0"), an input port enable signal SIPE and an output port enable signal SOPE to the first device, device 1, of the serial interconnection. At each of the devices, an input ID contained in the serial input SI is inputted in response to the SIPE signal and the ID generation (+1) occurs. Thus, the ID is incremented by the value+1. The generated ID is outputted in response to the SOPE signal to the next device. The ID generation occurs at each of devices 1-N and the generated ID is transferred from each device to the next device. The memory controller 840 also includes a receiving circuit 820 that receives the generated ID, IDN, and an output port enable output signal SOPEQ from the last device, device N, of the serial interconnection. When the ID output of the last device N, IDN is provided to the receiving circuit 820 in synchronization with the OPEQ signal, the receiving circuit 820 recognizes the number of devices in the serial interconnection, N. It is assumed that the clock latency of each device is identical and its value is CL. The entire latency of N devices in the serial interconnection is N×CL.

Figure 11:
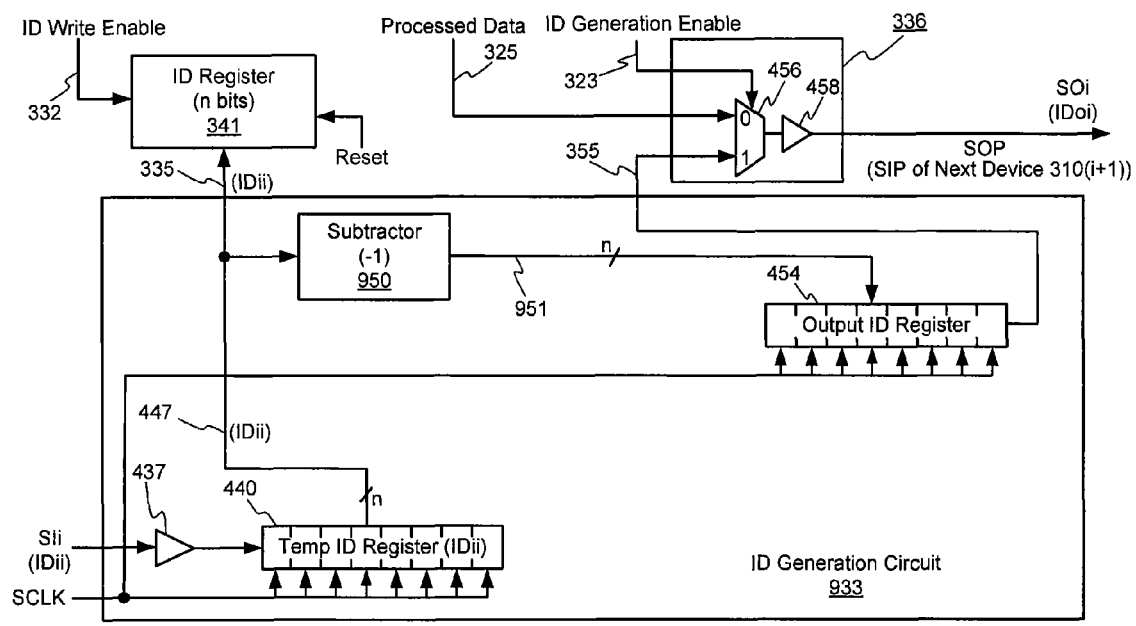
FIG. 11 illustrates another example of the ID generation circuit.

FIG. 11 shows another example of the ID generation circuit. The ID generation circuit is similar to that of FIG. 6. A difference is that the ID generation circuit 933 of FIG. 11 has a subtractor 950, instead of the adder 450 of FIG. 6. Referring to FIGS. 10 and 11, the memory controller 840 provides an initial ID, (e.g., value "M") to device 1. The subtractor 950 of each device performs the subtraction of one from the received ID, IDii, to provide a subtracted signal 951 to the output ID register 454 that is a parallel-to-serial register. The newly generated ID is serially outputted from the register 454 to the output circuit 336 and is provided to the next device. With such a subtraction, consecutive IDs from high to low are established. By the example, the sequence of device ID numbers could be consecutive integers from high to low. The initial ID0 provided by the providing circuit 810 to the first device, device 1, is IDM. The sequence is from M to (M−N) with a decrement by 1.

Figure 12:
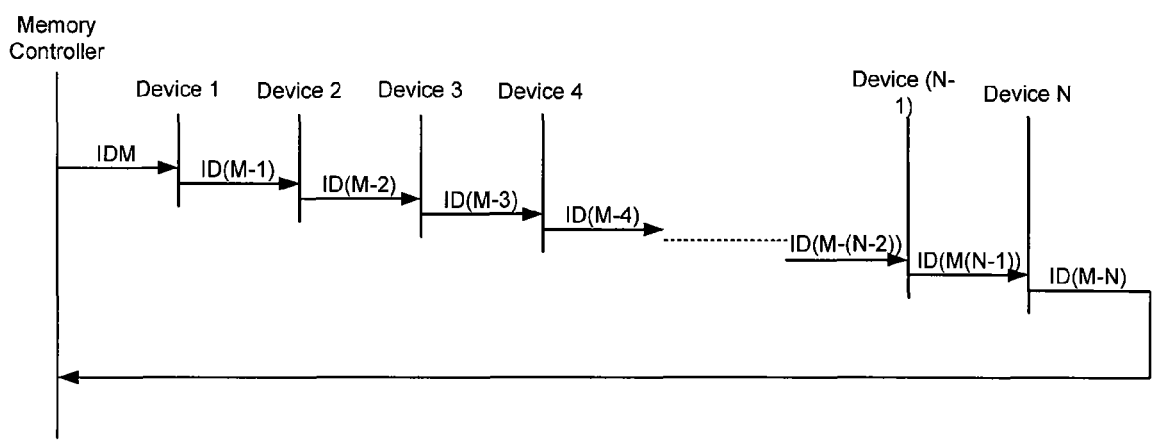
FIG. 12 is a schematic diagram illustrating a protocol conducted in the devices shown in FIG. 11.

FIG. 12 shows a protocol conducted in the devices shown in FIG. 11. The consecutive sequence of device ID numbers generated by the devices shown in FIG. 11 is shown in Table 3.

TABLE 3

| Device No. | Assigned ID Number | Output ID |
|---|---|---|
| Device 1 | IDM | ID(M − 1) |
| Device 2 | ID(M − 1) | ID(M − 2) |
| Device 3 | ID(M − 2) | — |
| — | — | ID(M − (N − 2)) |
| Device (N − 1) | ID(M − (N − 2)) | ID(M − (N − 1)) |
| Device N | ID(M − (N − 1)) | ID(M − N) |

In this example, the receiving circuit 820 recognizes the number N of devices in the serial interconnection from the value of (M−N). With assumption of the same clock latency CL of devices, the entire latency of N devices in the serial interconnection is N×CL.

There are variations to the above-described embodiments. The adder 450 or the subtractor 950 can be replaced with an alternative operator that enables the sequence. For example, the adder 450 could be replaced with another calculator of another pre-defined number.

In the above-described embodiments, the operation has been described based on the active "high" signals for the purpose of simplicity. The circuits may be designed to perform the operation based on the "low" active signals, in accordance with a design preference. The control signals may have two bytes or more bytes in accordance with operation code assignment. Timing control can be changed from the sequential and multiple clocks enabled by command type to the single clock with additional control signals to activate the selected serial registers. The sequence of issuing multiple clocks can be varied in accordance with the specification of timing, arrangement of addresses, and the length of addresses. As mentioned before, it can apply the serial Flash memory or the product with serial input bit stream control.

In the embodiments described above, the device elements and circuits are connected to each other as shown in the figures, for the sake of simplicity. In practical applications of the present invention to apparatus, devices, elements, circuits, etc. may be connected directly to each other. As well, devices, elements, circuits etc. may be connected indirectly to each other through other devices, elements, circuits, etc., necessary for operation of the apparatus. Thus, in actual configuration, the circuit elements and devices are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A system comprising:
   a controller,
   a plurality of memory devices in a serial interconnection configuration, each of the plurality of memory devices having a select input connection, an input connection, an output connection and an enable input connection, a first one of said plurality of devices being coupled to the controller,
   the select input connection of each device being coupled to receive a mode select signal, each device being set in a device identifier production mode in response to the mode select signal,
   the input connection of each device being coupled to the output connection of a previous device, the output connection of each device being coupled to the input connection of a subsequent device, the input connection of the first device of the serial interconnection configuration being coupled to receive an initial device identifier from the controller,
   the enable input connection of each device being coupled to receive an enable signal from the previous device, the device being enabled to receive a device identifier in response to the enable signal,
   each of the plurality of memory devices including:
      a producer, set in the ID production mode, configured to produce a device identifier in response to an input device identifier received through its input connection in response to the enable signal, the device identifier produced by the producer of each device to be provided to the subsequent device through its output connection,
   the controller including a receiver configured:
      to receive the device identifier from a last device of the serial interconnection configuration, and to determine the number of the plurality of memory devices in the serial interconnection configuration in response to the received device identifier.

2. The system of claim 1, wherein the producer comprises:
   a device identifier receiver configured to receive the device identifier from the previous device through the input connection thereof;
   a device identifier generator configured to generate a device identifier in response to the received device identifier and the received control signal; and
   a device identifier provider configured to output the device identifier generated by the device identifier generator.

3. The system of claim 2, wherein the device identifier generator comprises:
   a calculator configured to calculate the received device identifier using a pre-defined value.

4. The system of claim 3, wherein the calculator comprises:
   an adder configured to add the pre-defined value to the received device identifier to provide a new device identifier.

5. The system of claim 4, wherein the adder comprises:
   adding circuitry configured to add 1 to the received device identifier.

6. The system of claim 4, wherein the device identifier receiver comprises:
   a register configured to register the received device identifier in serial manner; and
   a provider configured to output each of the registered device identifiers in parallel manner, thereby providing the device identifier for the calculation.

7. The system of claim 3, wherein the calculator comprises:
   a subtracter configured to subtract the pre-defined value from the received device identifier to provide a new device identifier.

8. The system of claim 7, wherein the subtracter comprises:
   subtracting circuitry configured to subtract 1 from the received device identifier.

9. The system of claim 8, wherein the controller comprises:
   a provider configured to provide the initial device identifier to a first device in the serial interconnection configuration.

10. The system of claim 1, wherein the receiver comprises:
    a processor configured to:
       receive the device identifier from the last device; and
       determine the number of devices in the serial interconnection configuration in response to the received device identifier.

11. The system of claim 1, wherein the receiver comprises:
    a processor configured to:
       receive the device identifier from the last device; and
       determine a latency of the plurality of memory devices in the serial interconnection configuration in response to the received device identifier.

12. The system of claim 1, wherein the controller comprises:
    a signal provider configured to provide the initial device identifier to the input connection of the first device of the serial interconnection configuration.

13. The system of claim 1, wherein the signal provider is configured to provide the control signal to the control input connection of the first device of the serial interconnection configuration.

14. The system of claim 1, wherein the controller comprises:
    a signal receiver coupled to the output connection of the last device of the serial interconnection configuration, the signal receiver being configured to receive the device identifier from the output connection of the last device of the serial interconnection configuration.

15. A method for determining the characteristic of a plurality of memory devices in a serial interconnection configuration, each of the plurality of memory devices having a select input connection, an input connection, a output connection and an enable input connection, the select input connection of each device being coupled to receive a mode select signal, the input connection of each device being coupled to the output connection of a previous device, the enable input connection of each device being coupled to receive an enable signal from the previous device, the output connection of each device being coupled to the input connection of a subsequent device, the input connection of a first device of the serial interconnection configuration being coupled to receive an initial device identification from a controller, each of the plurality of memory devices including a producer, the method comprising:

setting the device in a device identification production mode in response to the received mode select signal;

by the producer of the device set in the device identification production mode, producing a device identifier in a response to an input device identifier received through its input connection in response to the enable signal, the device identifier produced by the producer of each device to be provided to the subsequent device through its output connection, by the controller, receiving the device identifier from the last device in the serial interconnection configuration; and determining, in the controller, the number of the plurality of memory devices in the serial interconnection configuration in response to the received device identifier.

16. The method of claim 15, further comprising:

providing a device identifier from a last device configured to determine the device related characteristic of the serial interconnection configuration.

17. The method of claim 16, wherein the producer comprises:

calculating the received device identifier using a pre-defined value in response to the control signal.

18. The method of claim 17, wherein the step of calculating comprises:

adding the pre-defined value to the received device identifier to provide a new device identifier.

19. The method of claim 17, wherein the step of determining comprises:

determining a latency of the plurality of memory devices in the serial interconnection configuration in response to the received device identifier.

* * * * *